(12) United States Patent
Kim et al.

(10) Patent No.: US 8,492,832 B2
(45) Date of Patent: Jul. 23, 2013

(54) SEMICONDUCTOR DEVICE

(75) Inventors: Ji-young Kim, Yongin-si (KR);
Gyo-young Jin, Seoul (KR);
Hyeong-sun Hong, Seongnam-si (KR);
Yoo-sang Hwang, Suwon-si (KR);
Sung-kwan Choi, Hwaseong-si (KR);
Hyun-woo Chung, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/571,805

(22) Filed: Aug. 10, 2012

(65) Prior Publication Data

US 2013/0037882 A1    Feb. 14, 2013

(30) Foreign Application Priority Data

Aug. 12, 2011  (KR) .......................... 10-2011-0080646

(51) Int. Cl.
*H01L 29/78* (2006.01)
(52) U.S. Cl.
USPC ................................. 257/331; 257/E29.264

(58) Field of Classification Search
None
See application file for complete search history.

(56) References Cited

U.S. PATENT DOCUMENTS

| 2007/0032033 | A1* | 2/2007 | Heineck et al. | 438/386 |
| 2008/0096353 | A1* | 4/2008 | Rouh et al. | 438/270 |
| 2010/0327337 | A1* | 12/2010 | Yang | 257/311 |
| 2012/0119285 | A1* | 5/2012 | Yang | 257/329 |

FOREIGN PATENT DOCUMENTS

| JP | 2008-053274 | 3/2008 |
| KR | 1020070002590 A | 1/2007 |
| KR | 1020110001261 A | 1/2011 |

* cited by examiner

*Primary Examiner* — Thomas L Dickey
*Assistant Examiner* — Joseph Schoenholtz
(74) *Attorney, Agent, or Firm* — F. Chau & Associates, LLC

(57) ABSTRACT

A semiconductor device includes a semiconductor substrate including an active region defined by a device isolation layer, a trench extending across the active region, a buried gate filling a part of the trench and including a base portion, a first extension portion, and a second extension portion extending along an inner wall of the trench, and having different heights at sides of the base portion, and a capping layer formed on the buried gate and filling the trench.

16 Claims, 11 Drawing Sheets

SEMICONDUCTOR DEVICE

CROSS-REFERENCE TO RELATED APPLICATIONS

This application claims the benefit of Korean Patent Application No. 10-2011-0080646, filed on Aug. 12, 2011, in the Korean Intellectual Property Office, the disclosure of which is incorporated by reference herein in its entirety.

TECHNICAL FIELD

Embodiments of the inventive concept relate to a semiconductor device, and more particularly, to a semiconductor device including a buried gate.

DISCUSSION OF THE RELATED ART

With increasing demand for highly integrated and high-performance semiconductor devices, a reduction in the size of the transistors would yield higher-density semiconductor devices. A transistor can its size by a buried gate design.

SUMMARY

Embodiments of the inventive concept provide a semiconductor device including a buried gate. The semiconductor device has enhanced electrical characteristics.

According to an embodiment of the inventive concept, there is provided a semiconductor device including a semiconductor substrate including an active region defined by a device isolation layer, wherein a first trench extends across the active region, a first buried gate filling a part of the first trench, the first buried gate including a base portion, a first extension portion, and a second extension portion, wherein the first and second extension portions extend along an inner wall of the first trench and have different heights from the base portion and a capping layer formed on the first buried gate, the capping layer filling the trench.

The second extension portion extends higher than the first extension portion from the base portion.

A part of the second extension portion extends having a predetermined thickness with respect to the first trench.

An upper portion of the second extension portion has a predetermined thickness with respect to the first trench.

The first extension portion is tapered to a pointed upper portion.

The semiconductor device further includes a first impurity region and a second impurity region having a first conductive type, the first and second impurity regions formed in an upper portion of the active region at sides of the first trench and a third impurity region having a second conductive type different from the first conductive type, the third impurity region formed under the first impurity region and the second impurity region. The third impurity region forms a first p-n junction and a second p-n junction with the first impurity region and the second impurity region, respectively, wherein the first p-n junction and the second p-n junction have different levels.

The first impurity region and the second impurity region are adjacent to the first extension portion and the second extension portion, respectively, and the first p-n junction and the second p-n junction are formed lower than an uppermost portion of the first extension portion and an uppermost portion of the second extension portion.

A height of the first buried gate that overlaps the first impurity region is lower than a height of the first buried gate that overlaps the second impurity region.

The first impurity region and the second impurity region include n-type impurity regions, and the third impurity region includes a p-type impurity region.

The semiconductor device further includes an interlayer insulating layer covering the semiconductor substrate in which the capping layer and the device isolation layer are formed, and a conductive plug passing through the interlayer insulating layer, the conductive plug electrically connected to the first impurity region or the second impurity region, wherein the conductive plug contacts a part of the capping layer or a part of the device isolation layer.

The semiconductor device further includes a second trench extending across the active region and a second buried gate, wherein the first and second buried gates are symmetrical to each other in the first and second trenches, respectively.

The first and second buried gates are adjacent to the second extension portion.

According to an embodiment of the inventive concept, there is provided a semiconductor device including a semiconductor substrate comprising an active region defined by a device isolation layer, wherein a first trench extends across the active region, a nonsymmetrical first buried gate extending along the first trench, the nonsymmetrical first buried gate filling a part of the first trench, wherein the nonsymmetrical first buried gate has a stepped upper surface, a capping layer formed on the nonsymmetrical first buried gate, the capping layer filling the first trench, a first impurity region and a second impurity region having a first conductive type, the first and second impurity regions formed in an upper portion of the active region at sides of the first trench and a third impurity region having a second conductive type different from the first conductive type, the third impurity region formed under the first impurity region and the second impurity region, wherein the third impurity region forms a first p-n junction and a second p-n junction with the first impurity region and the second impurity region, respectively, wherein the first p-n junction and the second p-n junction have different levels.

The nonsymmetrical first buried gate includes a base portion, a first extension portion, and a second extension portion, the first and second extension portions extend along an inner wall of the first trench and have different heights from the base portion.

The semiconductor device further includes a second trench extending across the active region and a second buried gate along the second trench, and wherein the second impurity region is formed in an upper portion of the active region between the first and second trenches.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
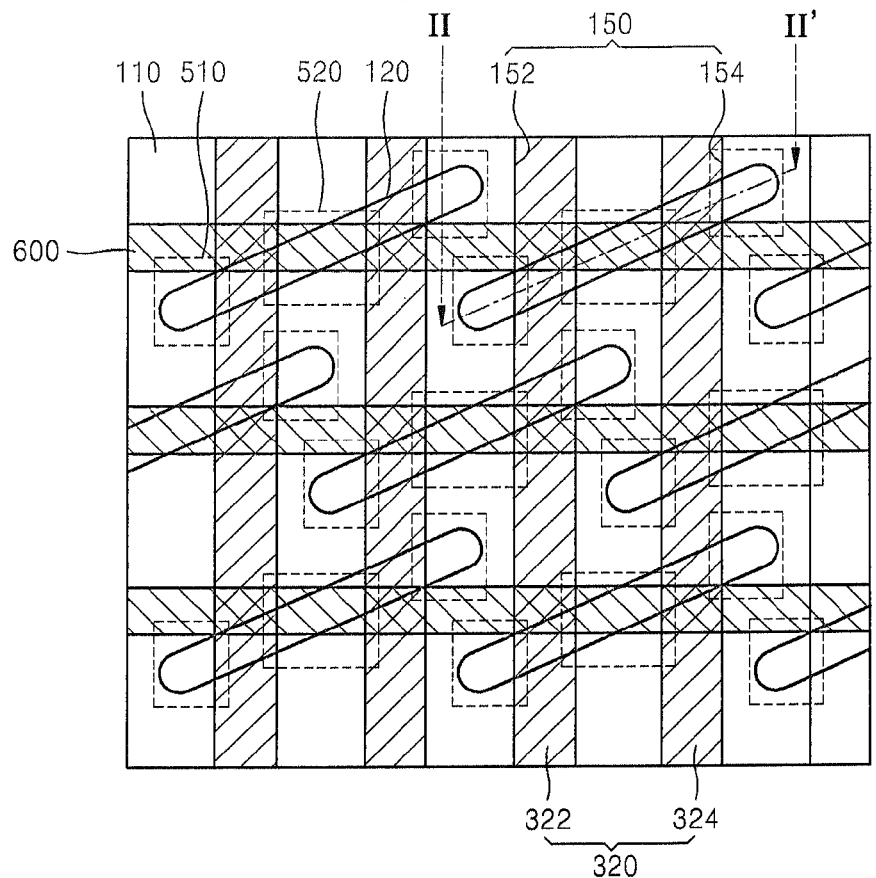
FIG. 1 is a schematic plan view of a layout of a semiconductor device according to an embodiment of the inventive concept.

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description. As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

It will be understood that when an element is referred to as being "connected to" or "contact" another element, it may be directly connected or contact the other element or intervening elements may be present.

As used herein, the singular forms "a," "an" and "the" may include the plural forms as well, unless the context clearly indicates otherwise.

FIG. 1 is a schematic plan view of a layout of a semiconductor device according to an embodiment of the inventive concept.

Referring to FIG. 1, a semiconductor substrate 100 includes a plurality of active regions 120 defined by a device isolation layer 110. Trenches 150 extend across the active regions 120. Buried gates 320 extend in the trenches 150 along the trenches 150.

The trenches 150 include first and second trenches 152 and 154 that cross one of the active regions 120. First and second buried gates 322 and 324 respectively extend in the first and second trenches 152 and 154 along the first and second trenches 152 and 154.

A bit line 600 extends across the active regions 120 in a direction different from a direction in which the buried gates 320 extend. Although the bit line 600 and the buried gates 320 extend perpendicularly to each other as shown, the embodiments of the inventive concept are not limited thereto.

A first conductive plug 510 is formed in two sides of each of the active regions 120. The first conductive plug 510 is electrically connected to the active regions 120. A capacitor (not shown) electrically connected to the first conductive plug 510 is formed on the first conductive plug 510. A second conductive plug 510 is disposed on each of the active regions 120 and the bit line 600 and electrically connects the active region 120 with the bit line 600.

The layout of the semiconductor device shows an arrangement relationship between the constitutional elements, and a shape of the semiconductor device is not limited thereto.

FIGS. 2 to 16 are cross-sectional views taken along a line II-II' of FIG. 1.

FIGS. 2 through 10 are cross-sectional views of a semiconductor device for describing manufacturing a semiconductor device according to an embodiment of the inventive concept.

Figure 2:
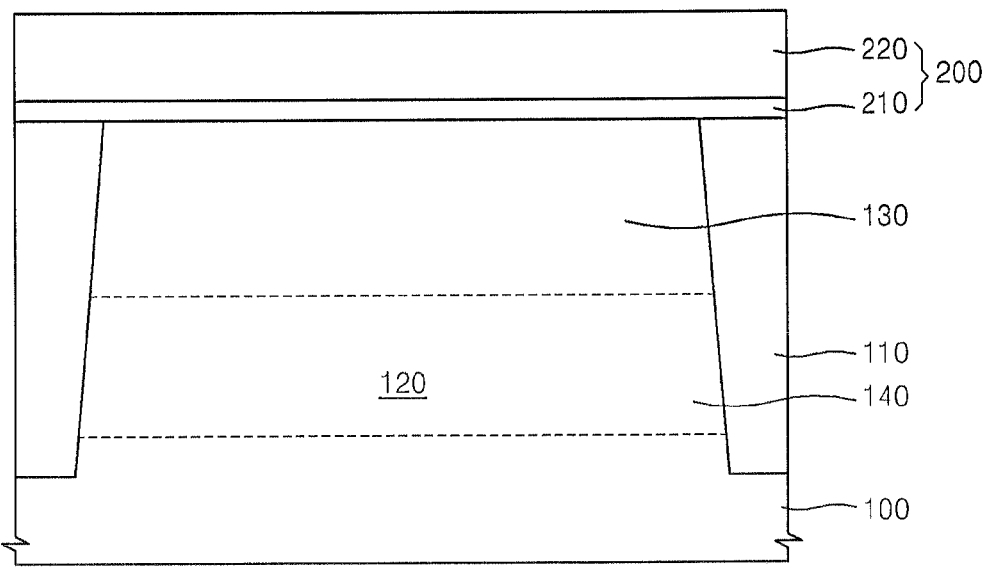
FIG. 2 is a cross-sectional view of a semiconductor device for describing an operation of forming a hard mask layer according to an embodiment of the inventive concept.

FIG. 2 illustrates forming hard mask layers 200 according to an embodiment of the inventive concept.

Referring to FIG. 2, the active region 120 is defined by forming the device isolation layer 110 in the semiconductor substrate 100. The active region 120 is a part of the semiconductor substrate 100 on a virtual plane extending from a lowermost portion of the device isolation layer 110. The semiconductor substrate 100 includes a semiconductor material, for example, a group IV semiconductor, a group III-V compound semiconductor, or a group II-VI oxide semiconductor. For example, the group IV semiconductor includes silicon, germanium, or silicon-germanium. The semiconductor substrate 100 is provided as a bulk wafer or an epitaxial layer. Alternatively, the semiconductor substrate 100 includes, for example, a silicon-on-insulator (SOI) substrate or a gallium-arsenic substrate.

The device isolation layer 110 is formed of an insulating material. The device isolation layer 110 is formed by a local oxidation of silicon (LOCOS) process or a shallow trench isolation (STI) process. The device isolation layer 110 is formed of, for example, an oxide, a nitride, or a combination thereof. According to an embodiment, the device isolation layer 110 has a multi-layered structure that includes, for example, a buffer oxide layer, a trench liner nitride layer, and a buried oxide layer.

A first conductive region 130 and a second conductive region 140 are formed in the active region 120. The first conductive region 130 is formed in an upper portion of the active region 120. The second conductive region 140 is formed in a lower portion of the first conductive region 130. The first conductive region 130 and the second conductive region 140 contact each other and form a p-n junction. The first conductive region 130 has a first conductive type, and the second conductive region 140 has a second conductive type different from the first conductive type. For example, according to an embodiment, when the first conductive type is an n type, the second conductive type is a p type. For example, according to an embodiment, the first conductive region 130 includes an n-type impurity region, and the second conductive region 140 includes a p-type impurity region. Alternatively, when the first conductive type region has the p-type, the second conductive type region has the n-type region.

Thereafter, a source/drain region is formed in the first conductive region 130, and a channel is formed in the second conductive region 140.

The hard mask layers 200 that cover the active region 120 and the device isolation layer 110 are formed on the semiconductor substrate 100. The hard mask layers 200 includes a plurality of layers including a first hard mask layer 210 and a second hard mask layer 220. The first hard mask layer 210 and the second hard mask layer 220 are formed of materials having different etching selection ratios. When the first hard mask layer 210 is formed of, for example, an oxide, the second hard mask layer 220 is formed of, for example, a nitride.

Figure 3:
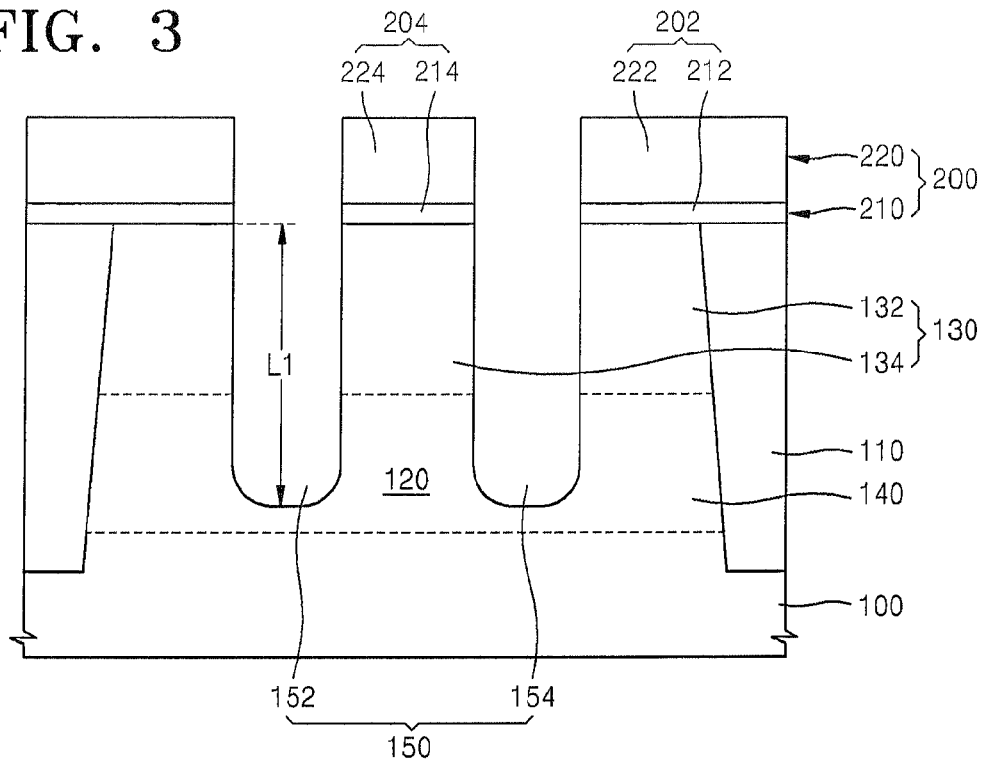
FIG. 3 is a cross-sectional view of a semiconductor device for describing an operation of forming a trench according to an embodiment of the inventive concept.

FIG. 3 illustrates forming the trenches 150 according to an embodiment of the inventive concept.

Referring to FIG. 3, the trenches 150 extend across the active region 120. The trenches 150 have a first depth L1 from an uppermost surface of the active region 120. The first depth L1 is, for example, between about 1000 μm and about 200 μm. A lowermost surface of the trenches 150 has a higher level than a level of a lowermost surface of the device isolation layer 110. The first conductive region 130 is divided into a first impurity region 132 and a second impurity region 134 by the trenches 150. The trenches 150 include the first and second trenches 152 and 154 that extend across the active region 120.

The trenches 150 are formed by photolithography and etching processes. For example, according to an embodiment, a photoresist pattern (not shown) is formed by the photolithography process, a part of the hard mask layers 200 of FIG. 2 is removed by using the photoresist pattern as a mask, and a first isolation hard mask layer 202 and a second isolation hard mask layer 204 that are separated from each other by the trenches 150 are formed. The active region 120 is partially exposed by the first isolation hard mask layer 202 and the second isolation hard mask layer 204. The trenches 150 are formed by removing the exposed part of the active region 120 by using the hard mask layers 200 as an etching mask.

The second isolation hard mask layer 204 is disposed between the first trench 152 and the second trench 154. The first isolation hard mask layer 202 is disposed at two sides of the first trench 152 and the second trench 154.

The first hard mask layer 210 and the second hard mask layer 220 of the first isolation hard mask layer 202 are referred to as a first layer 212 and a second layer 214, respectively. The first hard mask layer 210 and the second hard mask layer 220 of the second isolation hard mask layer 204 are referred to as a third layer 214 and a fourth layer 224, respectively.

Figure 4:
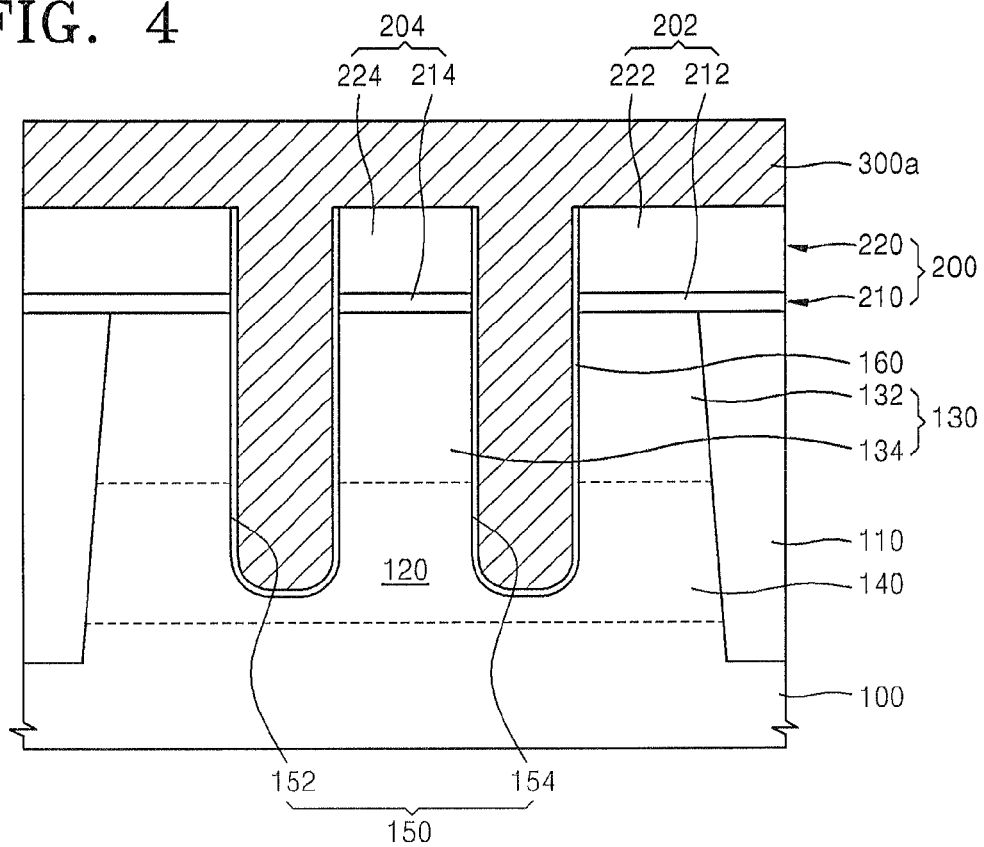
FIG. 4 is a cross-sectional view of a semiconductor device for describing an operation of forming a gate material layer according to an embodiment of the inventive concept.

FIG. 4 illustrates forming a gate material layer 300a according to an embodiment of the inventive concept.

Referring to FIG. 4, a gate insulating layer 160 is formed in the trenches 150, and then the gate material layer 300a is formed on the semiconductor substrate 100 to fill the trenches 150. The gate material layer 300a includes a conductive layer, such as for example, a doped polysilion layer, a metal layer, a metal silicide layer, or a combination thereof.

The gate insulating layer 160 is formed of an oxide, a nitride, and an oxide-nitride. According to an embodiment, the gate insulating layer 160 includes, for example, a silicon oxide layer or an insulating layer with a high dielectric constant. Alternatively, the gate insulating layer 160 has a multi-layered structure that includes an oxide layer, a nitride layer, and an oxide-nitride layer. The active region 120 and the gate material layer 300a are electrically insulated from each other by the gate insulating layer 160.

Although the gate insulating layer 160 is formed in the trenches 150 in FIG. 4, according to an embodiment, the gate insulating layer 160 is formed on the first isolation hard mask layer 202 and the second isolation hard mask layer 204.

Figure 5:
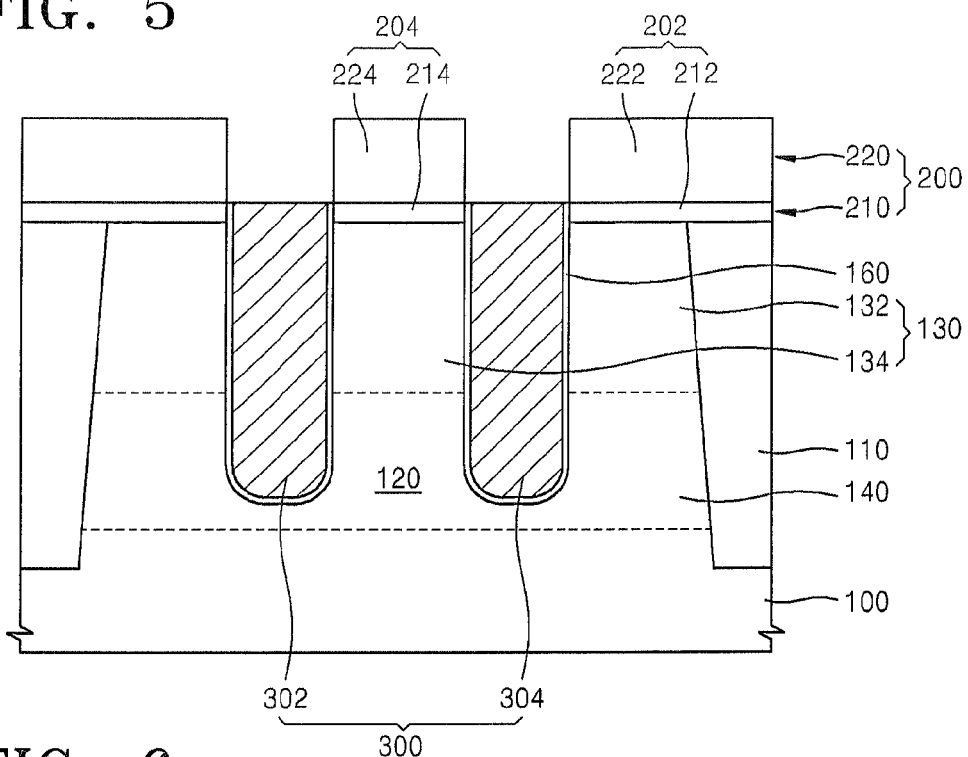
FIG. 5 is a cross-sectional view of a semiconductor device for describing an operation of removing a part of a gate material layer according to an embodiment of the inventive concept.

FIG. 5 illustrates removing a part of the gate material layer 300a according to an embodiment of the inventive concept.

Referring to FIG. 5, isolation gate material layers 300 are formed in the first trench 152 and the second trench 154 by removing a part of the gate material layer 300a using an etch-back process. The isolation gate material layers 300 include a first isolation gate material layer 302 formed in the first trench 152 and a second isolation gate material layer 304 formed in the second trench 154. The first isolation gate material layer 302 and the second isolation gate material layer 304 are spaced apart from each other and are not directly connected to each other.

The isolation gate material layers 300 and the first hard mask layer 210 have the same upper surface level. Alternatively, although not shown, an upper surface of the isolation gate material layers 300 is formed between an upper surface of the first hard mask layer 210 and an upper surface of the second hard mask layer 220. Although an upper surface of the isolation gate material layers 300 is lower than an upper surface of the second hard mask layer 220 and the first isolation gate material layer 302 and the second isolation gate material layer 304 are spaced apart from each other, the upper surface of the isolation gate material layers 300 is higher than or has the same level as an upper surface of the first hard mask layer 210.

Figure 6:
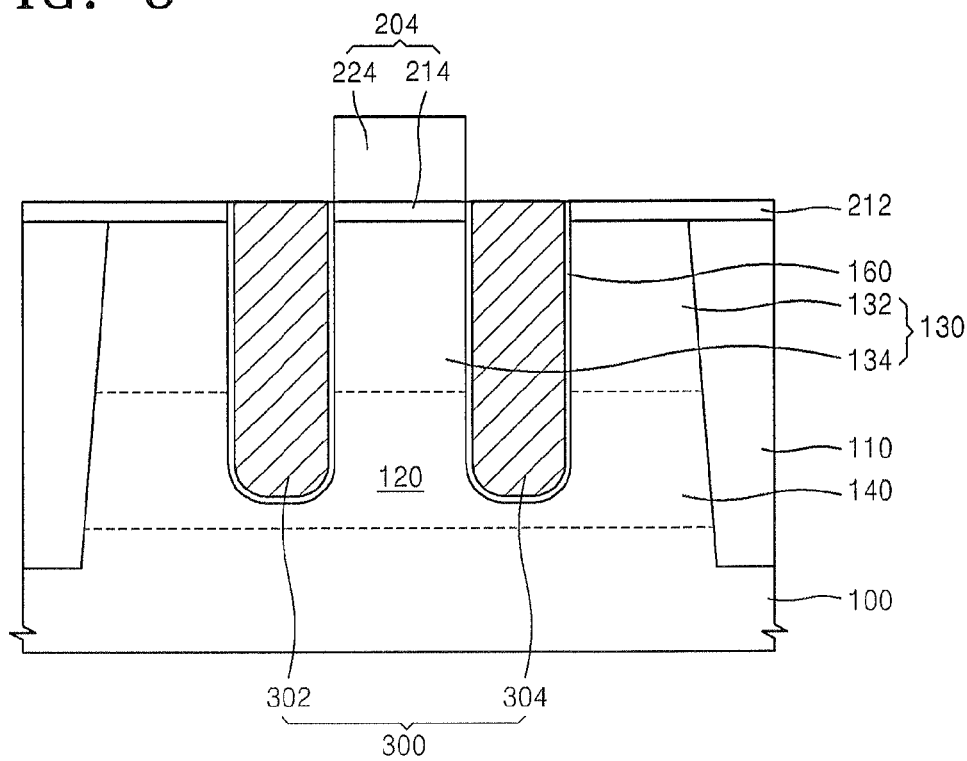
FIG. 6 is a cross-sectional view of a semiconductor device for describing an operation of removing a part of a second hard mask layer according to an embodiment of the inventive concept.

FIG. 6 illustrates removing a part of the second hard mask layer 220 according to an embodiment of the inventive concept.

Referring to FIG. 6, the first layer 212 of the first isolation hard mask layer 202 corresponding to the first hard mask layer 210 is exposed by removing the second layer 222 of the first isolation hard mask layer 202 corresponding to the second hard mask layer 220. The third layer 214 and the fourth layer 224 of the second isolation hard mask layer 204 corresponding to the first hard mask layer 210 and the second hard mask layer 220 remain. The second layer 222 of the first isolation hard mask layer 202 is removed by forming a photoresist pattern (not shown) which exposes the first isolation hard mask layer 202 and then etching the first isolation hard mask layer 202 by using the photoresist pattern as a mask.

Figure 7:
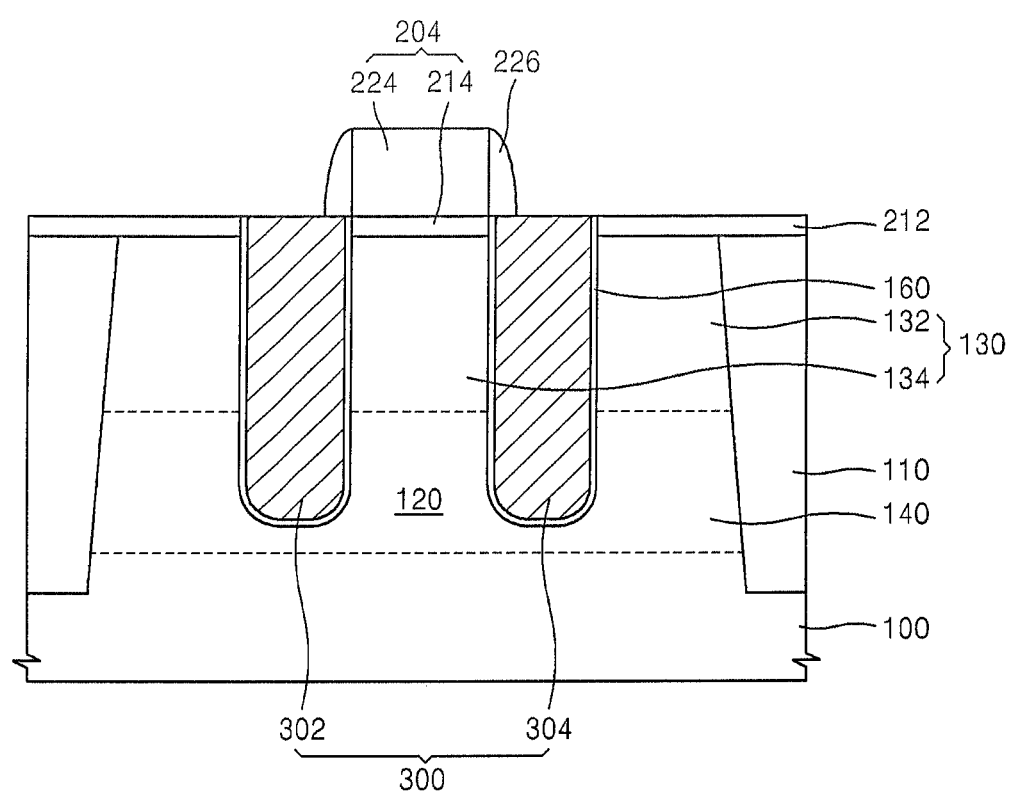
FIG. 7 is a cross-sectional view of a semiconductor device for describing an operation of forming a spacer layer according to an embodiment of the inventive concept.

FIG. 7 illustrates forming a spacer layer 226 according to an embodiment of the inventive concept.

Referring to FIG. 7, the spacer layer 226 that covers sidewalls of the fourth layer 224 is formed. The spacer layer 226 is formed by forming a spacer material layer (not shown) covering an entire top surface of the semiconductor substrate 100 and then performing an etch-back process on the spacer material layer. The spacer layer 226 is formed of the same material as the fourth layer 224 or a material having an etching selection ratio similar to an etching selection ratio of the fourth layer 224. According to an embodiment, the spacer layer 226 is formed of, for example, a nitride. The spacer layer 226 covers a part of the isolation gate material layers 300, the part neighboring the second isolation hard mask layer 204.

Figure 8:
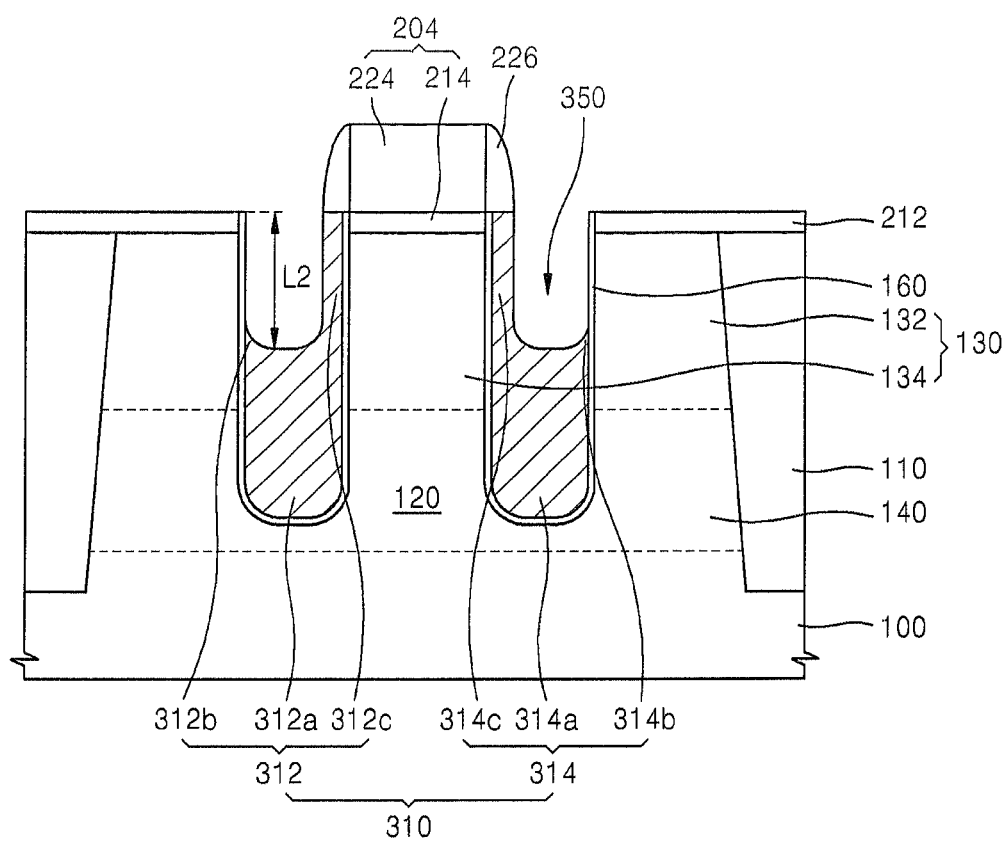
FIG. 8 is a cross-sectional view of a semiconductor device for describing an operation of forming a recessed region according to an embodiment of the inventive concept.

FIG. 8 illustrates forming a recessed region 350 according to an embodiment of the inventive concept.

Referring to FIG. 8, preliminary buried gates 310 having an upper surface on which the recessed region 350 are defined is formed by removing a part of the isolation gate material layers 300 of FIG. 7. The recessed region 350 has a second depth L2 from an uppermost surface of the preliminary buried gates 310. The preliminary buried gates 310 are formed by an etch-back process using the spacer layer 226, the fourth layer 224, and the first layer 214. The preliminary buried gates 310 include a first preliminary buried gate 312 and a second preliminary buried gate 314. The first preliminary buried gate 312 and the second preliminary buried gate 314 include preliminary base portions 312a and 314a, respectively, preliminary first extension portions 312b and 314b, respectively, and preliminary second extension portions 312c and 314c, respectively. The preliminary second extension portions 312c and 314c correspond to a part of the isolation gate material layers 300 of FIG. 7 that is covered by the spacer layer 226 and is not removed. The preliminary first extension portions 312b and 314b are formed as an etching source, such as an etching gas, is less transferred to a side portion of the isolation gate material layers 300 of FIG. 7 than a center of the layers 300 when the isolation gate material layers 300 is removed to form the recessed region 350. Heights of the preliminary first extension portions 312b and 314b are adjusted by changing a process condition for removing the isolation gate material layers 300.

When the recessed region 350 is formed, upper surfaces of the preliminary base portions 312a and 314a and the preliminary first extension portions 312b and 314b nonlinearly extend from the preliminary base portions 312a and 314a to the preliminary first extension portions 312b and 314b.

Figure 9:
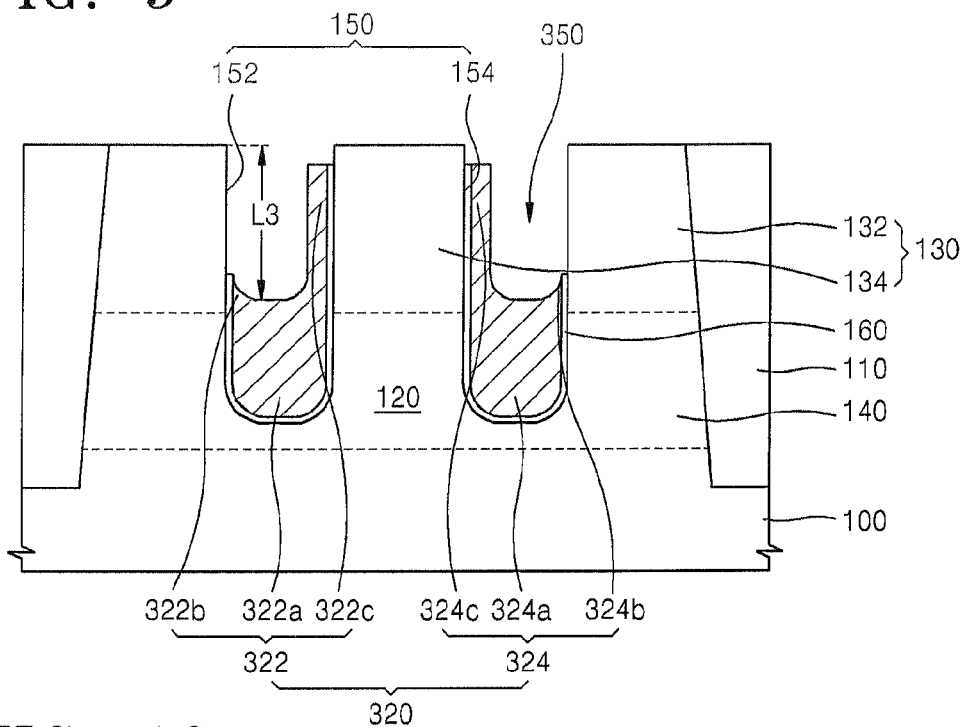
FIG. 9 is a cross-sectional view of a semiconductor device for describing an operation of forming a buried gate according to an embodiment of the inventive concept.

FIG. 9 illustrates forming a buried gate according to an embodiment of the inventive concept.

Referring to FIG. 9, the active region 120 is exposed by removing the first layer 212, the third layer 214, the fourth layer 224, and the spacer layer 226 of FIG. 8. The buried gates 320 are formed by removing a predetermined part of an upper portion of the preliminary buried gates 310 of FIG. 8 together with or separately from exposing the active region 120. When the buried gates 320 are formed, the recessed region 350 is increased and has a third depth L3 greater than the second depth L2 of FIG. 8. A detailed shape of the buried gates 320 will be described later.

Figure 10:
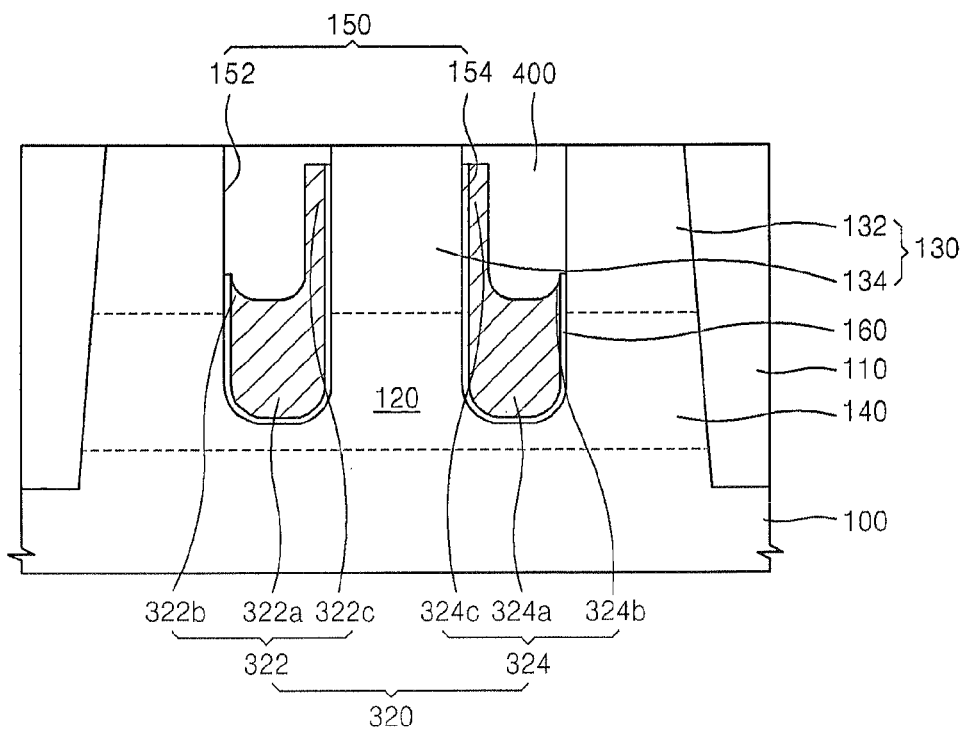
FIG. 10 is a cross-sectional view of a semiconductor device for describing an operation of forming a capping layer according to an embodiment of the inventive concept.

FIG. 10 illustrates forming a capping layer 400 according to an embodiment of the inventive concept.

Referring to FIG. 10, the trenches 150 are fully filled by forming the capping layer 400 in the recessed region 350 of FIG. 9. The capping layer 400 is formed by forming a capping material layer (not shown) that covers an entire top surface of the semiconductor substrate 100 and fully fills the trenches 150, and then performing a planarization process, such as an etch-back process or a CMP process, on the capping material layer. The capping layer 400 is formed of, for example, a nitride.

Figure 11:
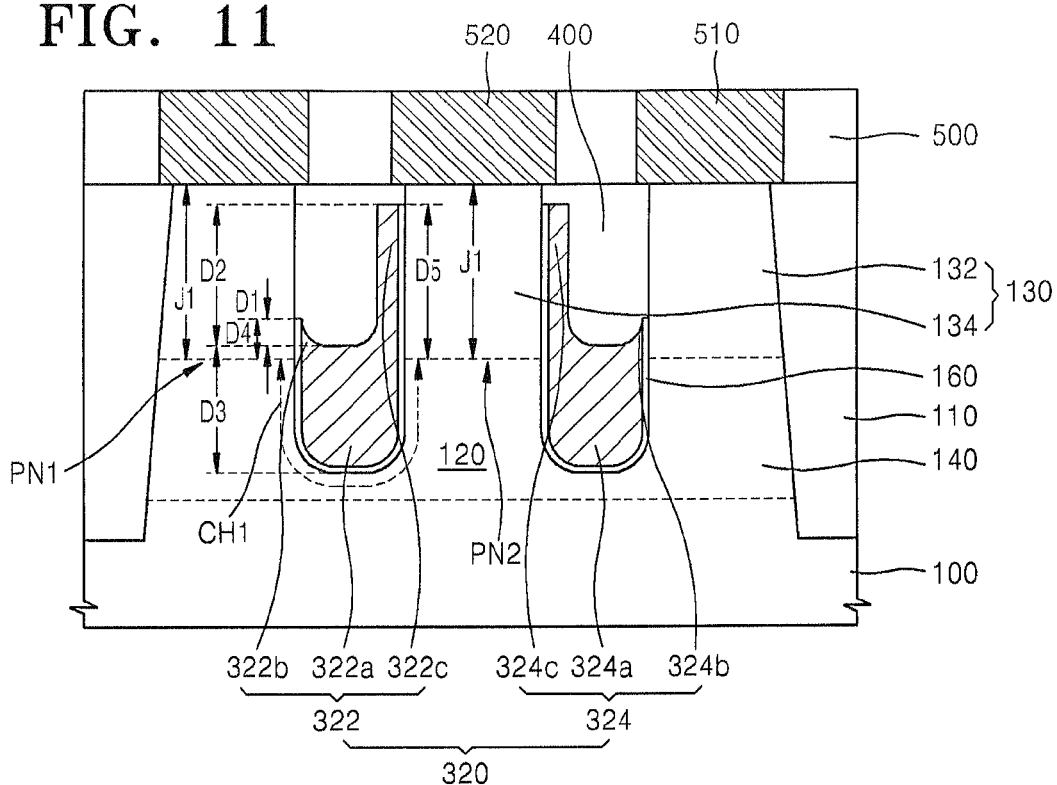
FIG. 11 is a cross-sectional view of a semiconductor device for describing an operation of forming a conductive plug according to an embodiment of the inventive concept.

FIG. 11 illustrates forming conductive plugs according to an embodiment of the inventive concept.

Referring to FIG. 11, an interlayer insulating layer 500 and conductive plugs 510 and 520 that pass through the interlayer insulating layer 500 are formed on the semiconductor substrate 10.

The active region 120 defined by the device isolation layer 110 and the trenches 150 extending across the active region 120 is formed in the semiconductor substrate 100. The buried gates 320 filled in a part of the trenches 150 extend in the trenches 150 along the trenches 150. The gate insulating layer 160 is disposed between the trenches 150 and the buried gates 320.

The trenches 150 including the first trench 152 and the second trench 154 extend across the active region 120. The two buried gates 322 and 324 extend along the first trench 152 and the second trench 154, respectively, and are disposed in the first trench 152 and the second trench 154, respectively. The two buried gates 322 and 324 are partially filled in the first trench 152 and the second trench 154, respectively. The buried gates 322 and 324 are filled from the lowermost portions of the first trench 152 and the second trench 154 to portions of the trenches 152 and 154, the portions lower than an upper surface of the active region 120. The capping layer 400 is formed on the buried gates 322 and 324 and filled in the first trench 152 and the second trench 154. An upper surface of the capping layer 400 has the same or similar level to the upper surface of the active region 120.

The first and second buried gates 322 and 324 include base portions 322a and 324a, respectively, first extension portions 322b and 324b, respectively, and second extension portions 322c and 324c, respectively. The base portions 322a and 324a are filled from the lowermost portions of the first trench 152 and the second trench 154 to a predetermined height D3 of the trenches 152 and 154. The first extension portions 322b and 324b extend from the base portions 322a and 324a along inner walls of first sides of the first trench 152 and the second trench 154. The second extension portions 322c and 324c extend from the base portions 322a and 324a along inner walls of second sides of the first trench 152 and the second trench 154. Thus, each of the buried gates 322 and 324 has a non-symmetrical shape with a stepped upper surface.

The base portions 322a and 324a, the first extension portions 322b and 324b, and the second extension portions 322c and 324c of the first and second buried gates 322 and 324 are discerned from each other for purposes of description of structures of the first and second buried gates 322 and 324, and are integrally formed with each other. The base portions 322a and 324a fill the trenches 152 and 154 from the lowermost portions of the first trench 152 and the second trench 154 to a predetermined height D3 of the trenches 152 and 154, and the first extension portions 322b and 324b and the second extension portions 322c and 324c are spaced apart from each other and extend along the inner walls of the first trench 152 and the second trench 154 at two sides of the first trench 152 and the second trench 154.

The first buried gate 322 and the second buried gate 324 have a similar structure, and the first buried gate 322 and the second buried gate 324 have a symmetrical structure. The first buried gate 322 and the second buried gate 324 extend along the first and second trenches 152 and 154, face each other, and are symmetrical to each other. The second extension portion 322c of the first buried gate 322 and the second extension portion 324c of the second buried gate 324 are formed on the inner walls of the first trench 152 and the second trench 154, the inner walls neighboring the second extension portion 322c and the second extension portion 324c. The second extension portions 322c and 324c are adjacent to each other, and the first extension portions 322b and 324b are apart from each other. The second extension portions 322c and 324c are symmetrical to each other, and the first extension portions 322b and 324b are symmetrical to each other. The shape of the first buried gate 322 is described below in detail. The first buried gate 322 is the same as the second buried gate 324 except that the first buried gate 322 and the second buried gate 324 have a symmetrical structure, and thus a detailed description of the shape of the second buried gate 324 will be omitted.

The first extension portion 322b and the second extension portion 322c of the first buried gate 322 have different heights with respect to the base portion 322a. A height of the second extension portion 322c is greater than a height of the first extension portion 322b, and the second extension portion 322c extends higher than the first extension portion 322b with respect to the base portion 322a. The first extension portion 322b has a first height D1, and the second extension portion 322c has a second height D2 larger than the first height D1.

An upper portion of the first extension portion 322b of the first buried gate 322 has a pointed shape. The first extension portion 322b of the first buried gate 322 is tapered upward from the base portion 322a.

The second extension portion 322c of the first buried gate 322 is tapered upward from the base portion 322a in the same manner as the first extension portion 322b. However, the second extension portion 322c of the first buried gate 322 extends from the base portion 322a and has a predetermined thickness with respect to the first trench 152. An upper portion of the second extension portion 322c of the first buried gate 322 has a predetermined thickness with respect to the first trench 152 and is greater than the remainder of the second extension portion 322c.

The first extension portion 322b of the first buried gate 322 has a pointed upper portion, and the second extension portion 322c has a blunt upper portion.

The first impurity region 132 and the second impurity region 134 are formed in an upper portion of the active region 120 at two sides of the first trench 152 or the second trench 154. The first impurity region 132 and the second impurity region 134 are the first conductive type regions. The first impurity region 132 is formed in the upper portion of the active region 120 and is adjacent to one of the two sides of the first trench 152 or the second trench 154. The second impurity region 134 is formed in the upper portion of the active region 120 and is adjacent to the other one of the two sides of the first trench 152 or the second trench 154.

When the second extension portion 322c of the first buried gate 322 and the second extension portion 324c of the second buried gate 324 are formed to be adjacent to each other, the second impurity region 134 is formed in the upper portion of the active region 120 between the first trench 152 and the second trench 154, and the first impurity region 132 is formed in the upper portion of the active region 120 at two sides of the first trench 152 and the second trench 154, with the trenches 152 and 154 positioned between the two sides.

A third impurity region 140 contacting the first impurity region 132 and the second impurity region 134 is formed under the first impurity region 132 and the second impurity region 134. The third impurity region 140 has a second conductive type different from the first conductive type, and is also referred to as the second conductive region 140. When the first conductive type is an n type, the second conductive type is a p type. The first impurity region 132 and the second impurity region 134 include n type impurity regions, and the third impurity region 140 includes a p type impurity region. When the first conductive type is a p type, the second conductive type is an n type.

The first impurity region 132 and the third impurity region 140, and the second impurity region 134 and the third impurity region 140 form a first p-n junction PN1 and a second p-n junction PN2, respectively. The first p-n junction PN1 and the second p-n junction PN2 have a first junction depth J1. The first junction depth J1 of the first p-n junction PN1 and the second p-n junction PN2 has the same value. The first p-n junction PN1 and the second p-n junction PN2 are formed to be lower than the uppermost portions of the first extension portions 322b and the second extension portion 322c of the first buried gate 322, respectively. The first impurity region 132 and the second impurity region 134 partially overlap the first extension portions 322b and the second extension portion 322c of the first buried gate 322.

A fourth height D4 of the first buried gate 322 that overlaps the first impurity region 132 is smaller than a fifth height D5 of the first buried gate 322 that overlaps the second impurity region 134. According to an embodiment, the fourth height D4 is, for example, between about 5 μm and about 20 μm. According to an embodiment, the fifth height D5 is, for example, between about 30 μm and about 100 μm. According to an embodiment, the fourth height D4 has a relatively small value, thus minimizing gate induced drain leakage (GIDL). The fifth height D5 has a relatively great value, thus reducing resistance. In more detail, an inversion layer is formed in the second impurity region 134 by a bias applied to the second extension portion 322c of the first buried gate 322, and thus a series resistance factor in relation to a current flowing in the second impurity region 134 is reduced. Accordingly, a leakage current can be minimized and a driving current can be increased. The first extension portions 322b of the first buried gate 322 contacting the first impurity region 132 has a pointed shape, and thus an electric field applied to the first extension portions 322b of the first buried gate 322 is reduced due to field straying, thus further reducing the leakage current.

The first and second conductive plugs 510 and 520 are formed on the first impurity region 132 and/or the second impurity region 134 and are electrically connected to the first impurity region 132 and/or the second impurity region 134. For example, according to an embodiment, the first conductive plug 510 is formed on the first impurity region 132 and is electrically connected to the first impurity region 132. The second conductive plug 520 is formed on the second impurity region 134 and is electrically connected to the second impurity region 134.

The first conductive plug 510 is formed to contact a part of the capping layer 400 and a part of the device isolation layer 110. According to an embodiment, the first conductive plug 510 has a greater width than a width of the first impurity region 132 by about 10 μm and about 20 μm and thus contacts a part of the capping layer 400 and a part of the device isolation layer 110 neighboring the first impurity region 132.

The second conductive plug 520 is formed to contact a part of the capping layer 400. According to an embodiment, the second conductive plug 520 has a greater width than a width of the second impurity region 134 by about 10 μm and about 30 μm and thus contacts a part of the capping layer 400 neighboring the first impurity region 132.

The bit line 600 of FIG. 1 is formed on the second conductive plug 520, and the second conductive plug 520 electrically connects the bit line 600 with the second impurity region 134. A capacitor (not shown) electrically connected to the first conductive plug 510 is formed on the first conductive plug 510.

Figure 12:
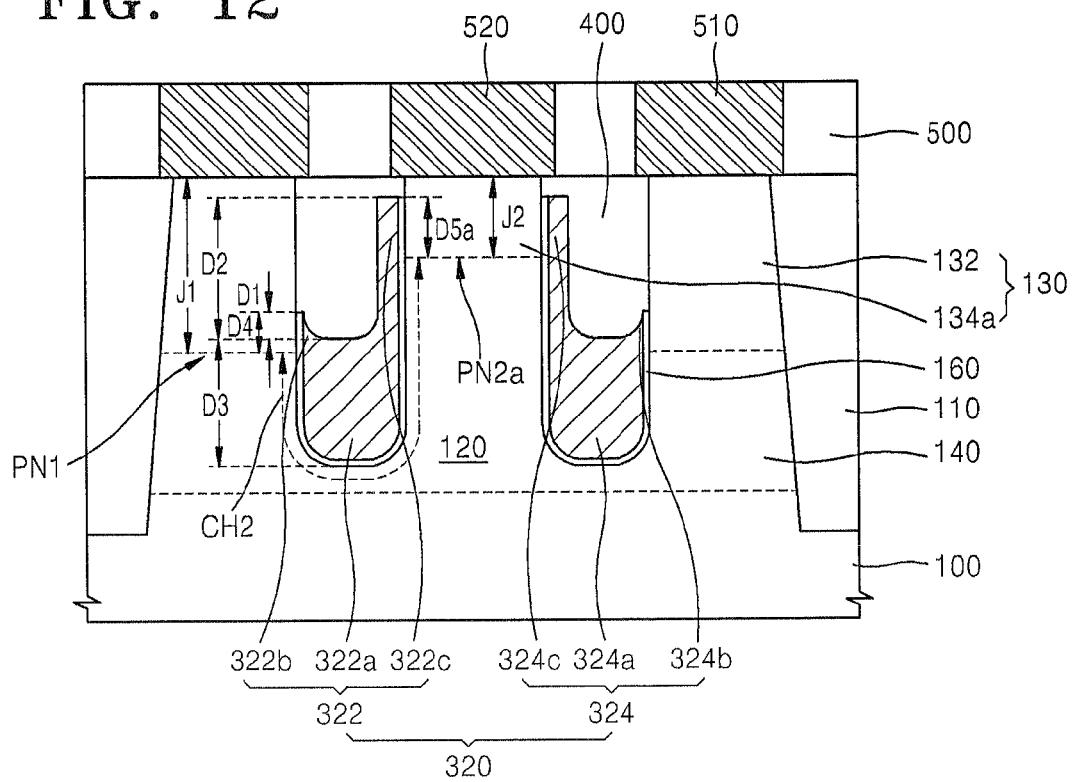
FIG. 12 is a cross-sectional view of a semiconductor device according to an embodiment of the inventive concept.

FIG. 12 is a cross-sectional view of a semiconductor device according to an embodiment of the inventive concept. The semiconductor device of FIG. 12 differs from the semiconductor device of FIG. 11 in terms of a depth J2 of a second junction PN2a.

Referring to FIG. 12, the first impurity region 132 and a second impurity region 134a are formed in an upper portion of the active region 120 at two sides of the first trench 152 or the second trench 154. The third impurity region 140 contacting the first impurity region 132 and the second impurity region 134a is formed under the first impurity region 132 and the second impurity region 134a. The third impurity region 140 has a second conductive type different from a first conductive type. When the first conductive type is an n type, the second conductive type is a p type. The first impurity region 132 and the second impurity region 134a are n-type impurity regions, and the third impurity region 140 is a p-type impurity region. On the contrary, when the first conductive type region is the p type region, the second conductive type region is the n type region.

The first impurity region 132 and the third impurity region 140, and the second impurity region 134a and the third impurity region 140 form the first p-n junction PN1 and a second p-n junction PN2a, respectively. The first p-n junction PN1 and the second p-n junction PN2a have the first junction depth J1 and a second junction depth J2, respectively. The first p-n junction PN1 and the second p-n junction PN2a have different levels. The first junction depth J1 and the second junction depth J2 have different levels. The second junction depth J2 is smaller than the first junction depth J1.

The first p-n junction PN1 and the second p-n junction PN2a are formed to be lower than the uppermost portions of the first extension portion 322b and the second extension portion 322c of the first buried gate 322, respectively. The first impurity region 132 and the second impurity region 134a partially overlap the first extension portion 322b and the second extension portion 322c of the first buried gate 322.

The fourth height D4 of the first buried gate 322 that overlaps the first impurity region 132 is smaller than a fifth height D5a of the first buried gate 322 that overlaps the second impurity region 134a. According to an embodiment, the fourth height D4 has a relatively small value, thus minimizing GIDL, and the fifth height D5a has a relatively great value, thus reducing resistance. Accordingly, a leakage current can be minimized and a driving current can be increased.

Referring to FIGS. 11 and 12, the fifth height D5 of FIG. 11 is greater than the fifth height D5a of FIG. 12. Thus, a channel length CH2 of FIG. 12 is greater than a channel length CH1 of FIG. 11, thus facilitating integration of the semiconductor device.

The semiconductor devices of FIGS. 11 and 12 have a complementary relationship between the channel length and resistance. According to an embodiment, the fifth heights D5 and D5a increase or the channel lengths CH1 and CH2 increase.

FIGS. 13 through 16 are cross-sectional views of a semiconductor device for describing a method of forming first p-n junctions PN1 and PN1a and second p-n junctions PN2 and PN2a having different junction depths according to embodiments of the inventive concept.

Figure 13:
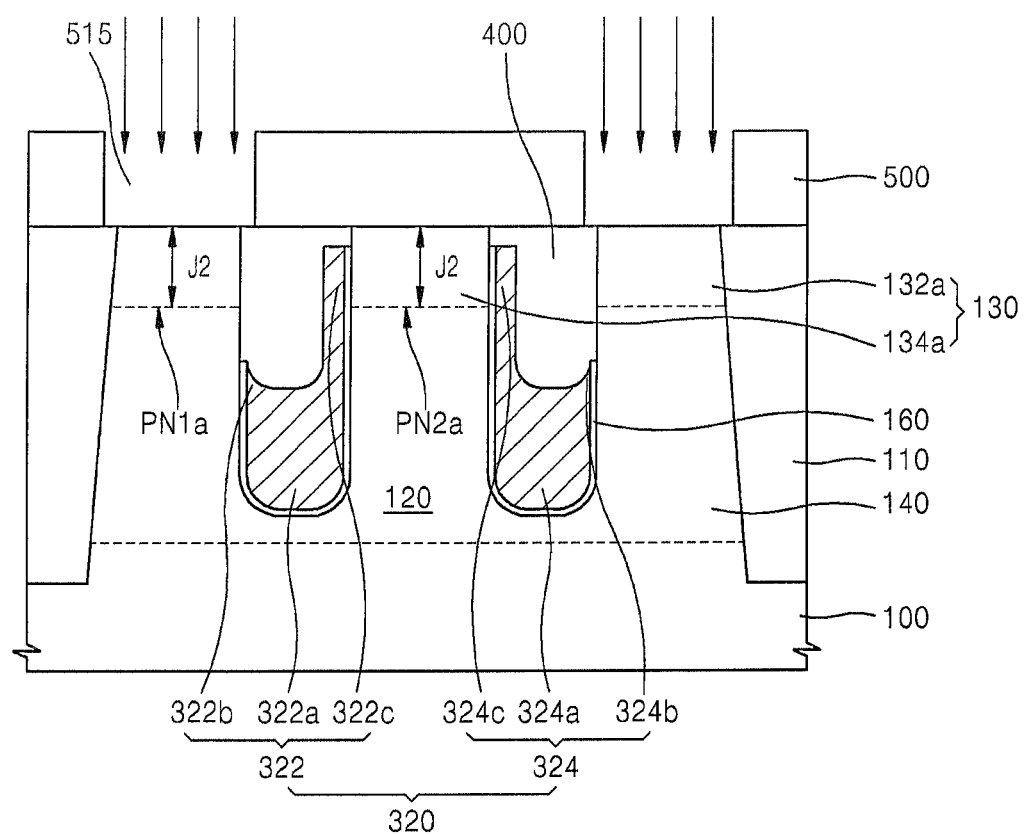
FIGS. 13 through 16 are cross-sectional views of a semiconductor device for describing a method of forming first p-n junctions and second p-n junctions having different junction depths according to embodiments of the inventive concept.
Figure 14:
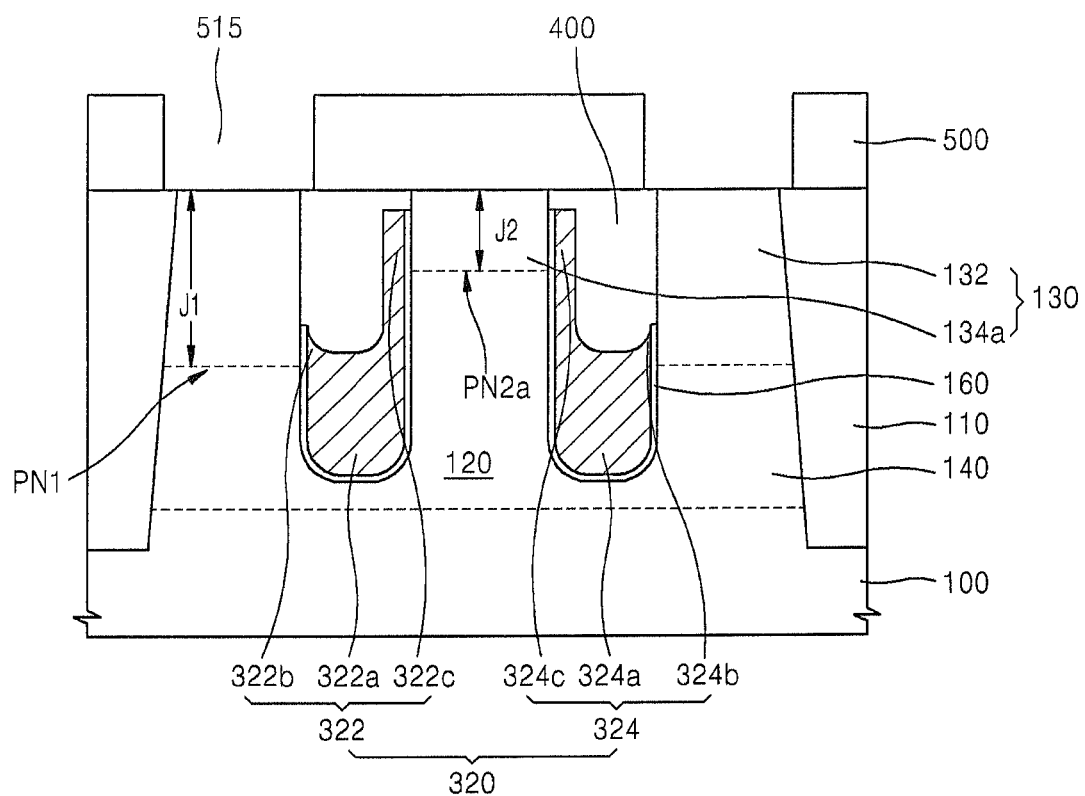

Referring to FIGS. 13 and 14, an interlayer insulating layer 500 including a first opening portion 515 is formed on the semiconductor device 100. The first opening portion 515 is formed to pass through the interlayer insulating layer 500 to form the first conductive plug 510 of FIG. 12. The first p-n junction PN1a and the second p-n junction PN2a are formed to have the second junction depth J2. According to an embodiment, the first p-n junction PN1 having the first junction depth J1 is formed by ion-injecting first conductive impurities through the first opening portion 515 into an upper portion of the third impurity region 140 neighboring the first impurity region 132a.

Accordingly, the first p-n junction PN1 and the second p-n junction PN2a are formed to have different levels. The first junction depth J1 and the second junction depth J2 have different values. The second junction depth J2 is smaller than the first junction depth J1.

For purposes of illustration, the second conductive plug 520 of FIG. 12 is not formed as shown in FIGS. 13 and 14. According to an embodiment, the second conductive plug 520 that passes through the interlayer insulating layer 500 is formed in advance.

Figure 15:
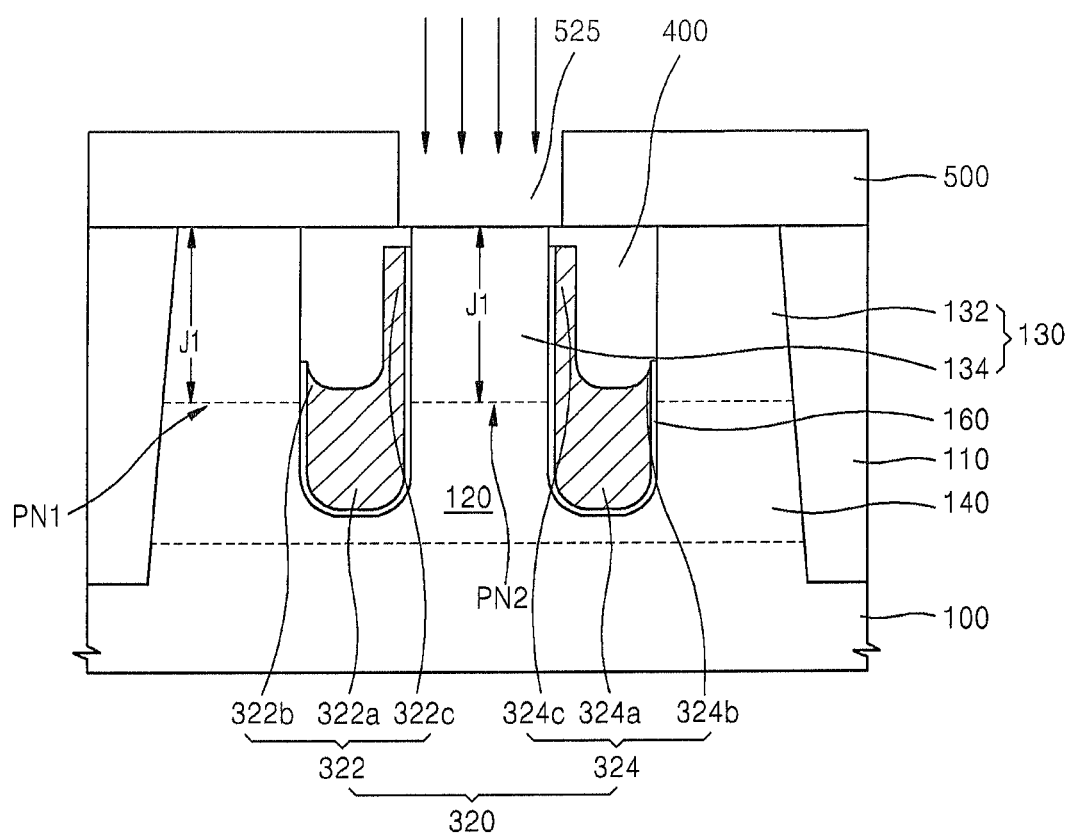
Figure 16:
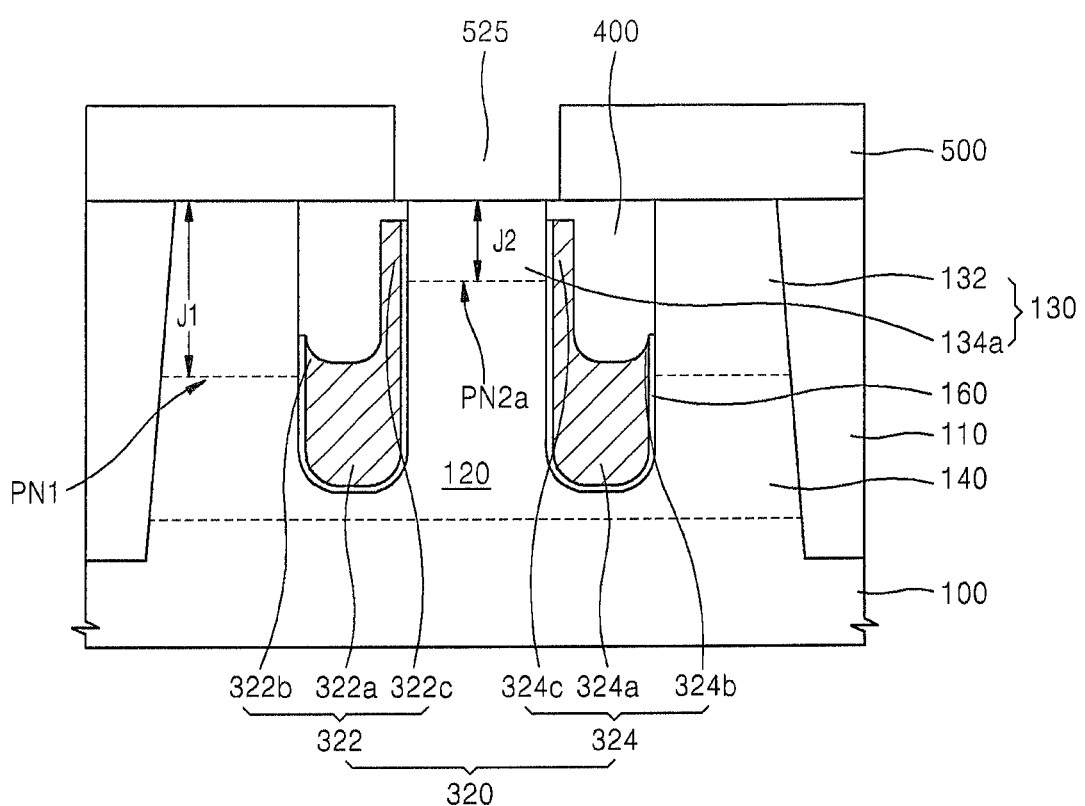

Referring to FIGS. 15 and 16, the interlayer insulating layer 500 including a second opening portion 525 is formed on the semiconductor device 100. The second opening portion 525 is formed to pass through the interlayer insulating layer 500 to form the second conductive plug 520 of FIG. 12. The first p-n junction PN1 and the second p-n junction PN2 are formed to have the first junction depth J1. According to an embodiment, the second p-n junction PN2a having the second junction depth J2 is formed by ion-injecting second conductive impurities through the second opening portion 525 into a lower portion of the second impurity region 134 neighboring the third impurity region 140.

Accordingly, the first p-n junction PN1 and the second p-n junction PN2a are formed to have different levels. The first junction depth J1 and the second junction depth J2 have different values. The second junction depth J2 is smaller than the first junction depth J1.

For purposes of illustration, the first conductive plug 510 of FIG. 12 is not formed as shown in FIGS. 15 and 16. According to an embodiment, the first conductive plug 510 that passes through the interlayer insulating layer 500 is formed in advance.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
    a semiconductor substrate comprising an active region defined by a device isolation layer, wherein a first trench extends across the active region;
    a first buried gate filling a part of the first trench, the first buried gate comprising a base portion, a first extension portion, and a second extension portion, wherein the first and second extension portions extend along an inner wall of the first trench and have different heights from the base portion; and
    a capping layer formed on the first buried gate, the capping layer filling the first trench.

2. The semiconductor device of claim 1, wherein the second extension portion extends higher than the first extension portion from the base portion.

3. The semiconductor device of claim 1, wherein a part of the second extension portion has a predetermined thickness with respect to the first trench.

4. The semiconductor device of claim 1, wherein an upper portion of the second extension portion has a predetermined thickness with respect to the first trench.

5. The semiconductor device of claim 1, wherein the first extension portion is tapered to a pointed upper portion.

6. The semiconductor device of claim 1, further comprising:
    a first impurity region and a second impurity region having a first conductive type, the first and second impurity regions formed in an upper portion of the active region at sides of the first trench; and
    a third impurity region having a second conductive type different from the first conductive type, the third impurity region formed under the first impurity region and the second impurity region.

7. The semiconductor device of claim 6, wherein the third impurity region and the first impurity region form a first p-n junction, and the third impurity region and the second impurity region forms a second p-n junction, and wherein the first p-n junction and the second p-n junction have different levels.

8. The semiconductor device of claim 7, wherein the first impurity region and the second impurity region are adjacent to the first extension portion and the second extension portion, respectively, and wherein the first p-n junction and the second p-n junction are formed lower than an uppermost portion of the first extension portion and an uppermost portion of the second extension portion.

9. The semiconductor device of claim 6, wherein a height of the first buried gate that overlaps the first impurity region is lower than a height of the first buried gate that overlaps the second impurity region.

10. The semiconductor device of claim 6, wherein the first impurity region and the second impurity region include n-type impurity regions, and the third impurity region include a p-type impurity region.

11. The semiconductor device of claim 6, further comprising an interlayer insulating layer covering the semiconductor substrate and a conductive plug passing through the interlayer insulating layer, the conductive plug electrically connected to the first impurity region or the second impurity region,
wherein the conductive plug contacts a part of the capping layer or a part of the device isolation layer.

12. The semiconductor device of claim 1, further comprising:
a second trench extending across the active region; and
a second buried gate,
wherein the first and second buried gates are symmetrical to each other in the first and second trenches, respectively.

13. The semiconductor device of claim 12, wherein the first and second buried gates are adjacent to the second extension portion.

14. A semiconductor device comprising:
a semiconductor substrate comprising an active region defined by a device isolation layer, wherein a first trench extends across the active region;
a nonsymmetrical first buried gate extending along the first trench, the nonsymmetrical first buried gate filling a part of the first trench, wherein the nonsymmetrical first buried gate has a stepped upper surface;
a capping layer formed on the nonsymmetrical first buried gate, the capping layer filling the first trench;
a first impurity region and a second impurity region having a first conductive type, the first and second impurity regions formed in an upper portion of the active region at sides of the first trench; and
a third impurity region having a second conductive type different from the first conductive type, the third impurity region formed under the first impurity region and the second impurity region, wherein the third impurity region forms a first p-n junction and a second p-n junction with the first impurity region and the second impurity region, respectively,
wherein the first p-n junction and the second p-n junction have different levels.

15. The semiconductor device of claim 14, wherein the nonsymmetrical first buried gate comprises a base portion, a first extension portion, and a second extension portion, the first and second extension portions extend along an inner wall of the first trench and have different heights from the base portion.

16. The semiconductor device of claim 14, further comprising:
a second trench extending across the active region; and
a second buried gate along the second trench,
wherein the second impurity region is formed in an upper portion of the active region between the first and second trenches.

* * * * *